(12) United States Patent
Kado et al.

(10) Patent No.: US 10,081,883 B2
(45) Date of Patent: Sep. 25, 2018

(54) SIC SINGLE CRYSTAL PRODUCTION METHOD AND PRODUCTION APPARATUS (71) Applicants: TOYOTA JIDOSHA KABUSHIKI KAISHA, Toyota-shi, Aichi-ken (JP); NIPPON STEEL & SUMITOMO METAL CORPORATION, Tokyo (JP)

(72) Inventors: Motohisa Kado, Gotemba (JP); Hironori Daikoku, Susono (JP); Kazuhiko Kusunoki, Tokyo (JP); Kazuaki Seki, Tokyo (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/400,456

(22) Filed: Jan. 6, 2017

(65) Prior Publication Data
US 2017/0198408 A1  Jul. 13, 2017

(30) Foreign Application Priority Data
Jan. 12, 2016  (JP) .................................. 2016-003634

(51) Int. Cl.
*C30B 29/36* (2006.01)
*C30B 19/06* (2006.01)
*C30B 19/04* (2006.01)

(52) U.S. Cl.
CPC ............ *C30B 19/068* (2013.01); *C30B 19/04* (2013.01); *C30B 19/062* (2013.01); *C30B 29/36* (2013.01)

(58) Field of Classification Search
CPC .................................. C30B 29/36; C30B 9/04
See application file for complete search history.

(56) References Cited

U.S. PATENT DOCUMENTS 6,824,611 B1* 11/2004 Kordina .................. C30B 23/00
117/105
2015/0020730 A1   1/2015  Masaki et al.
2015/0167196 A1   6/2015  Kado et al.

FOREIGN PATENT DOCUMENTS

| JP | 2008290889 A | 12/2008 |
| JP | 2014-019614 A | 2/2014 |
| WO | 2013/115272 A1 | 8/2013 |

* cited by examiner

*Primary Examiner* — Robert M Kunemund
(74) *Attorney, Agent, or Firm* — Oliff PLC (57) ABSTRACT

Provided is a method for producing a SiC single crystal having a concave growth surface and containing no inclusions, even when conducting large diameter crystal growth. This is achieved by a method for producing a SiC single crystal in which a seed crystal substrate held on a seed crystal holding shaft is contacted with a Si—C solution having a temperature gradient such that the temperature decreases from the interior toward the liquid level, to cause crystal growth of a SiC single crystal, wherein the seed crystal holding shaft has a shaft portion and a seed crystal holding portion at the bottom end of the shaft portion, and the ratio of the diameter D1 of the shaft portion to the diameter D2 of the seed crystal holding portion (D1/D2) is no greater than 0.28.

18 Claims, 8 Drawing Sheets

SIC SINGLE CRYSTAL PRODUCTION METHOD AND PRODUCTION APPARATUS

TECHNICAL FIELD

The present disclosure relates to a method for producing a SiC single crystal.

BACKGROUND ART

SiC single crystals are thermally and chemically very stable, superior in mechanical strength, and resistant to radiation, and also have superior physical properties, such as high breakdown voltage and high thermal conductivity, compared to Si single crystals. They are therefore able to exhibit high output, high frequency, voltage resistance and environmental resistance that cannot be realized with existing semiconductor materials, such as Si single crystals and GaAs single crystals, and are being considered ever more promising as next-generation semiconductor materials for a wide range of applications including power device materials that allow high power control and energy saving, device materials for high-speed large volume information communication, high-temperature device materials for vehicles, radiation-resistant device materials and the like.

Typical growth processes for growing SiC single crystals that are known in the prior art include gas phase processes, the Acheson process, and solution processes. Among gas phase methods, for example, sublimation processes have drawback in that grown single crystals have been prone to hollow penetrating defects known as "micropipe defects", lattice defects, such as stacking faults, and generation of polymorphic crystals. However, most SiC bulk single crystals are conventionally produced by sublimation processes, while attempts are being made to reduce defects in the grown crystals. In the Acheson process, heating is carried out in an electric furnace using silica stone and coke as starting materials, and therefore it has not been possible to obtain single crystals with high crystallinity due to impurities in the starting materials.

Solution processes are processes in which molten Si is formed or a molten liquid comprising another metal dissolved in molten Si is formed in a graphite crucible and C is dissolved into the molten liquid, and a SiC crystal layer is deposited and grown on a seed crystal substrate set in the low temperature zone. Solution processes are most promising for reducing defects because crystal growth is carried out in a state of near thermal equilibrium, compared to gas phase processes. Recently, therefore, methods for producing SiC single crystals by solution processes have been proposed (PTLs 1 and 2).

CITATION LIST

Patent Literature

[PTL 1] Japanese Unexamined Patent Publication No. 2014-019614
[PTL 2] Japanese Unexamined Patent Publication No. 2008-290889

SUMMARY OF THE INVENTION

Problems to be Solved by the Invention

In SiC single crystal growth by a solution process, it is effective, for minimizing formation of inclusions, to conduct the crystal growth so that the growth surface of the grown crystal has a concave shape, as described in PTL 1. With the prior art, such as PTL 1, however, conducting growth of SiC single crystals having large diameters of 30 mm or greater has been found to result in formation of inclusions in the grown crystals.

Figure 2:
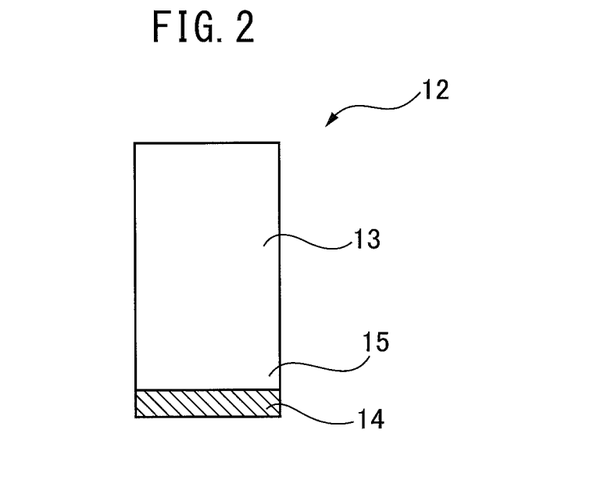
FIG. 2 is a cross-sectional schematic drawing showing a conventional seed crystal holding shaft and a seed crystal substrate held on the holding shaft.

In order to produce crystal growth so as to have a concave growth surface, it is necessary to have a temperature distribution in the horizontal direction such that the temperature falls from the center section toward the outer peripheral section directly below the crystal growth interface. By forming such a temperature distribution, it is possible to increase the degree of supersaturation of the Si—C solution at the outer peripheral section directly below the crystal growth interface, so that it is greater than the degree of supersaturation of the Si—C solution at the center section directly below the crystal growth interface. However, when a cylindrical seed crystal holding shaft having the same diameter for the shaft portion and the seed crystal holding portion, such as shown in FIG. 2 or described in PTL 1, is used for growth of a SiC single crystal having a large diameter of 30 mm or greater, it has been found that the effects of heat loss caused by heat conduction through the seed crystal holding shaft make it impossible to stably form a temperature distribution in the horizontal direction, such that a concave crystal growth surface cannot be stably maintained and inclusions can potentially result. FIG. 2 is a cross-sectional schematic drawing of a seed crystal holding shaft 12 wherein a shaft portion 13 and a seed crystal holding portion 15 have the same diameter. The top face of the seed crystal substrate 14 is held at the seed crystal holding portion 15 at the bottom end of the shaft portion 13.

In FIG. 2 of PTL 2 there is shown a seed crystal holding shaft comprising a seed crystal holding portion having a larger diameter than the shaft portion. The ratio of the diameter D1 of the shaft portion and the diameter D2 of the seed crystal holding portion of the seed crystal holding shaft (D1/D2) is 0.32. Even if such a seed crystal holding shaft comprising a shaft portion and seed crystal holding portion is used, it has been found that when a SiC single crystal having a large diameter of 30 mm or greater is grown, heat loss is increased at the center section of the seed crystal substrate due to heat conduction of the shaft portion, thus preventing a concave growth surface from being maintained and potentially forming inclusions.

Hence, there is a desire for a method for producing a SiC single crystal wherein a concave growth surface is maintained and no inclusions are formed, even when conducting large diameter crystal growth.

Means for Solving the Problems

The present disclosure relates to a method for producing a SiC single crystal wherein a seed crystal substrate held on a seed crystal holding shaft is contacted with a Si—C solution having a temperature gradient such that the temperature decreases from the interior toward the liquid level, to cause crystal growth of a SiC single crystal, wherein the seed crystal holding shaft has a shaft portion and a seed crystal holding portion at the bottom end of the shaft portion, and the ratio of the diameter D1 of the shaft portion to the diameter D2 of the seed crystal holding portion (D1/D2) is no greater than 0.28.

The present disclosure further relates to an apparatus for producing a SiC single crystal comprising:

a crucible that accommodates a Si—C solution, a heating device situated on the periphery of the crucible, and a seed crystal holding shaft situated in a movable manner in the vertical direction, the apparatus being based on a solution process in which the seed crystal substrate held on the seed crystal holding shaft is contacted with the Si—C solution that has been heated so as to have a temperature gradient such that the temperature decreases from the interior toward the liquid level, to grow a SiC single crystal from the seed crystal substrate, wherein the seed crystal holding shaft has a shaft portion and a seed crystal holding portion at the bottom end of the shaft portion, and the ratio of the diameter D1 of the shaft portion to the diameter D2 of the seed crystal holding portion (D1/D2) is no greater than 0.28.

Effect of the Invention

According to the present disclosure it is possible to stably grow a SiC single crystal having a concave crystal growth surface and containing no inclusions, even when conducting large diameter crystal growth.

DESCRIPTION OF EMBODIMENTS

Throughout the present specification, the indication "-1" in an expression, such as "(000-1) face", is used where normally a transverse line is placed over the numeral.

The present inventors have found that it is possible to stably grow a SiC single crystal having a concave crystal growth surface and containing no inclusions, even when growing a SiC single crystal having a large diameter of 30 mm or greater, by using a seed crystal holding shaft 12 having a shaft portion 13 and a seed crystal holding portion 15 at the bottom end of the shaft portion 13, wherein the seed crystal holding shaft 12 has a ratio of the diameter D1 of the shaft portion 13 to the diameter D2 of the seed crystal holding portion 15 (D1/D2) of 0.28 or smaller.

The present disclosure further relates to a method for producing a SiC single crystal in which a seed crystal substrate held on a seed crystal holding shaft is contacted with a Si—C solution having a temperature gradient such that the temperature decreases from the interior toward the liquid level, to cause crystal growth of a SiC single crystal, wherein the seed crystal holding shaft has a shaft portion and a seed crystal holding portion at the bottom end of the shaft portion, and the ratio of the diameter D1 of the shaft portion to the diameter D2 of the seed crystal holding portion (D1/D2) is no greater than 0.28.

Figure 3:
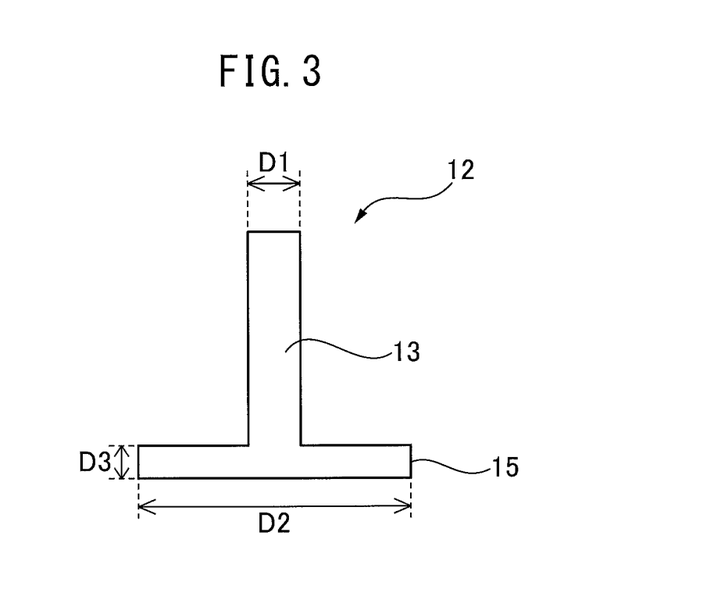
FIG. 3 is a cross-sectional schematic drawing showing an embodiment of a seed crystal holding shaft that may be used in the method of the present disclosure.

FIG. 3 shows an embodiment of a seed crystal holding shaft to be used in the method of the present disclosure. The seed crystal holding shaft 12 has a shaft portion 13 and a seed crystal holding portion 15 at the bottom end of the shaft portion 13. By using a seed crystal holding shaft wherein the ratio of the diameter D1 of the shaft portion 13 to the diameter D2 of the seed crystal holding portion 15 (D1/D2) is no greater than 0.28, it is possible to stably maintain a temperature distribution in the horizontal direction such that the temperature of the Si—C solution decreases from the center section toward the outer peripheral section directly below the seed crystal substrate, even when growing a SiC single crystal having a large diameter of 30 mm or greater. This allows growth of a SiC single crystal while maintaining a concave growth surface, and without forming inclusions. The diameter D1 is the diameter of the shaft portion 13 at the border with the seed crystal holding portion 15, and the diameter D2 is the diameter of the bottom face of the seed crystal holding portion 15 holding the seed crystal substrate.

The production method of the present disclosure is particularly effective when growing a SiC single crystal having a large diameter of 30 mm or greater, but it may be naturally be applied even for growth of a SiC single crystal having an orifice diameter of less than 30 mm, and allows stable growth of the SiC single crystal without formation of inclusions.

Inclusions are components of a Si—C solution used for SiC single crystal growth incorporated into the grown crystal. When inclusions are generated in a grown crystal, solvent components, such as Cr or Ni, that may be present in the solvent used as the Si—C solution may be detected as the inclusions.

Figure 12:
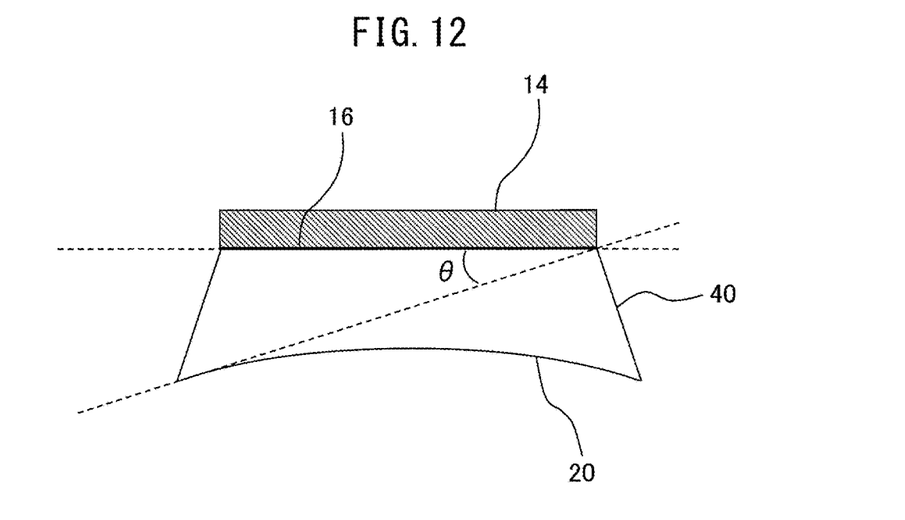
FIG. 12 is a cross-sectional schematic drawing of a SiC single crystal having a concave growth surface.

A concave growth surface is a concave crystal growth surface where a portion of the center section is substantially parallel to the on-axis surface 16 of crystal growth, and where the inclination increases toward the outer peripheral section of the growth surface. FIG. 12 shows a cross-sectional schematic drawing of a SiC single crystal 40 having a concave growth surface 20 grown from a seed crystal substrate 14.

The method of the present disclosure employs a solution process. A solution process is a process for producing a SiC single crystal in which a SiC seed crystal is contacted with a Si—C solution having a temperature gradient such that the temperature decreases from the interior toward the liquid level, to grow a SiC single crystal. By forming a temperature gradient such that the temperature decreases from the interior of the Si—C solution toward the surface of the solution, the surface region of the Si—C solution becomes supersaturated and a SiC single crystal is grown from the seed crystal substrate contacting with the Si—C solution.

The shaft portion 13 has a substantially cylindrical shape, while the seed crystal holding portion 15 has a substantially discoid shape. An orientation flat may also be formed in the seed crystal holding portion 15 so as to match the shape of the seed crystal substrate.

The ratio of the diameter D1 of the shaft portion 13 to the diameter D2 of the seed crystal holding portion 15 (D1/D2) is no greater than 0.28, preferably no greater than 0.26, more preferably no greater than 0.24, even more preferably no greater than 0.21 and even yet more preferably no greater than 0.16. The lower limit for the D1/D2 ratio is not particularly limited so long as it is in a range ensuring the strength of the shaft portion 13, and for example, it may be no less than 0.05, no less than 0.10, or no less than 0.16.

The diameter D2 of the seed crystal holding portion 15 may be changed according to the orifice diameter of the SiC single crystal to be grown, and is preferably 30 mm or greater, more preferably 40 mm or greater and even more preferably 50 mm or greater. The upper limit for the diameter D2 is not particularly limited, and may be no greater than 100 mm, for example.

The diameter D1 of the shaft portion 13 may be up to 8.4 mm, for example, so long as it is a diameter satisfying the aforementioned range for the D1/D2 ratio with respect to the diameter D2 of the seed crystal holding portion 15. The lower limit for the diameter D1 is not particularly limited so long as it is in a range ensuring the strength of the shaft portion 13, and it may be no less than 1.5 mm, no less than 3.0 mm, or no less than 4.8 mm, for example.

A thinner thickness D3 of the seed crystal holding portion 15 will result in increased radiative heat loss through the seed crystal holding portion 15 from the top face at the outer peripheral section of the seed crystal substrate, such that crystal growth with a concave growth surface will take place more easily. Therefore, the upper limit for the thickness D3 of the seed crystal holding portion 15 is preferably no greater than 15 mm, more preferably 10 mm and even more preferably no greater than 5 mm. If the thickness D3 of the seed crystal holding portion 15 is too small, the grown crystal will tend to undergo fissuring due to distortion by thermal expansion, and therefore the lower limit for the thickness of the seed crystal holding portion 15 is preferably 1 mm or greater, more preferably 2 mm or greater and even more preferably 3 mm or greater.

The seed crystal holding portion 15 may be formed in an integral manner with the shaft portion 13, or it may be formed by joining the seed crystal holding portion 15 to the end of the shaft portion 13. The shaft portion 13 and seed crystal holding portion 15 may be joined using a carbon adhesive. The constituent material of the shaft portion 13 and the constituent material of the seed crystal holding portion 15 may be graphite, and preferably the seed crystal holding portion 15 is formed in an integral manner with the shaft portion 13.

The top face of the seed crystal substrate is held at the bottom face of the seed crystal holding portion 15. The diameter of the top face of the seed crystal substrate is preferably within ±5 mm of the diameter of the bottom face of the seed crystal holding portion, and more preferably the shape of the top face of the seed crystal substrate is substantially the same as the shape of the bottom face of the seed crystal holding portion.

The seed crystal substrate that can be used in this method may be, for example, a SiC single crystal that has been normally produced by a sublimation process, but it is preferred to use a SiC single crystal having a flat growth surface and having a (0001) on-axis surface or (000-1) on-axis surface, or a SiC single crystal having a concave growth surface and having a (0001) face or (000-1) face at a section near the center section of the concave growth surface. The overall shape of the seed crystal substrate may be any desired shape, such as plate-like, discoid, cylindrical, columnar, truncated conic or truncated pyramidal.

Holding of the seed crystal substrate on the seed crystal holding portion 15 may be conducted by bonding the top face of the seed crystal substrate to the bottom face of the seed crystal holding portion 15 using an adhesive or the like.

Figure 4:
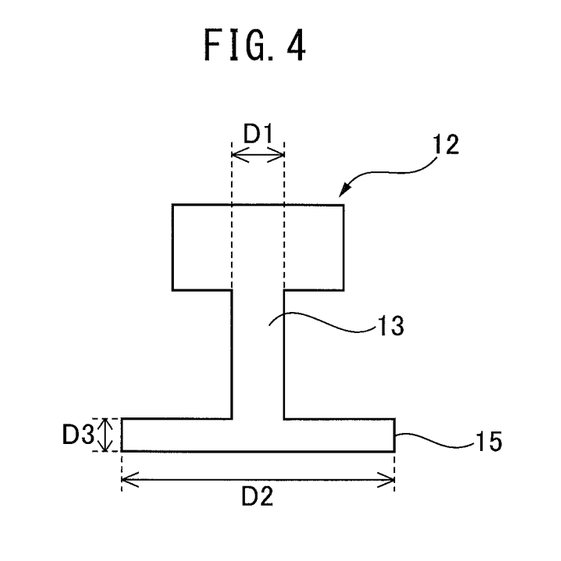
FIG. 4 is a cross-sectional schematic drawing showing an embodiment of a seed crystal holding shaft that may be used in the method of the present disclosure.
Figure 5:
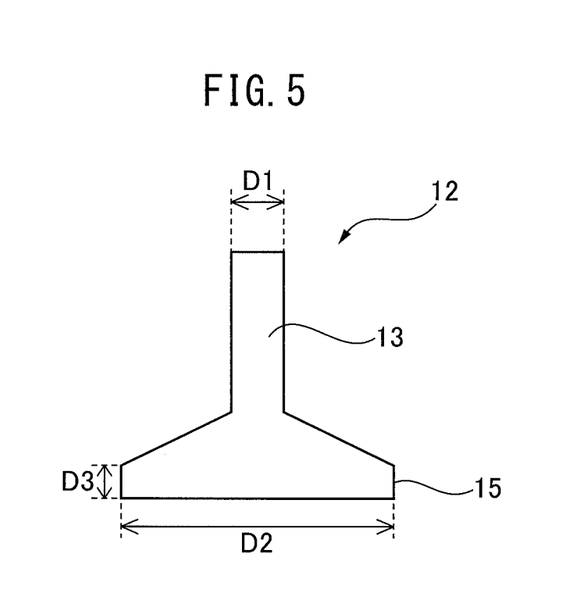
FIG. 5 is a cross-sectional schematic drawing showing an embodiment of a seed crystal holding shaft that may be used in the method of the present disclosure.

The seed crystal holding shaft 12 may have any desired construction so long as it has the shaft portion 13 and seed crystal holding portion 15 satisfying the aforementioned ratio D1/D2 so as to allow crystal growth with a concave growth surface, and for example, it may have the constructions as shown in FIGS. 4 and 5.

The seed crystal holding shaft 12 shown in FIG. 4 has a shaft portion 13 with a large diameter at the top section. Even if the top section of the shaft portion 13 has a large diameter, the seed crystal holding shaft 12 shown in FIG. 4 will produce substantially the same effect as the seed crystal holding shaft 12 shown in FIG. 3, so long as the ratio D1/D2 of the diameter D1 of the shaft portion 13 at the border with the seed crystal holding portion 15 and the diameter D2 of the seed crystal holding portion 15 satisfies the conditions for the ratio mentioned above.

The seed crystal holding shaft 12 shown in FIG. 5 has a seed crystal holding portion 15 with a trapezoid cross-section. Since the seed crystal holding portion 15 has a large thickness at the center section and a small thickness at the outer peripheral sections, it is easier to form a temperature distribution in the horizontal direction of the Si—C solution such that the temperature decreases from the center section toward the outer peripheral section directly below the growth surface, and therefore as long as the ratio D1/D2 satisfies the proportion specified above, the seed crystal holding shaft 12 shown in FIG. 5 produces substantially the same effect as the seed crystal holding shaft 12 shown in FIG. 3.

Figure 6:
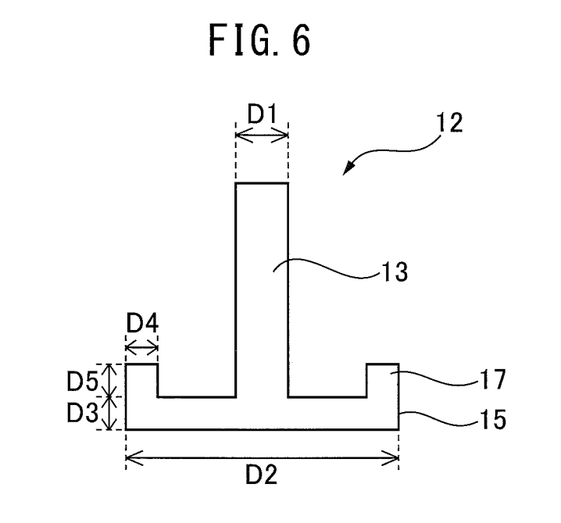
FIG. 6 is a cross-sectional schematic drawing showing an embodiment of a seed crystal holding shaft that may be used in the method of the present disclosure.

The perimeter of the seed crystal holding portion 15 preferably has a larger thickness than thickness at the center section of the seed crystal holding portion 15. FIG. 6 is a cross-sectional schematic drawing showing an embodiment of a seed crystal holding shaft 12 having a seed crystal holding portion 15 with a larger thickness at the perimeter than the thickness at the center section, and a shaft portion 13.

By making the thickness at the perimeter of the seed crystal holding portion 15 larger than the thickness at the center section, it is possible to minimize generation of cracks in the grown crystal.

When a seed crystal holding shaft 12 having a D1/D2 ratio of 0.28 or lower is used, it is possible to stably maintain a temperature distribution in the horizontal direction of the Si—C solution such that the temperature decreases from the center section to the outer peripheral section directly below the seed crystal substrate 14, but if the temperature at the outer peripheral section becomes too low, cracking may occur from the side edges of the grown crystal. If the perimeter of the seed crystal holding portion 15 has a larger thickness than the center section, then excessive reduction in temperature at the perimeter can be alleviated, thereby helping to prevent generation of cracks from the side edge of the grown crystal.

The perimeter of the seed crystal holding portion is the region within 5 mm from the side edge toward the center section of the seed crystal holding portion 15. The center section of the seed crystal holding portion is the region of the seed crystal holding portion 15 excluding the perimeter.

The method of forming the perimeter of the seed crystal holding portion 15 with a greater thickness than the thickness of the center section of the seed crystal holding portion 15 may be provision of a raised section 17 on the top face at the perimeter of the seed crystal holding portion 15, as shown in FIG. 6. The raised section 17 may be formed in an integral manner with the seed crystal holding portion 15, or it may be formed by joining the raised section 17 to the seed crystal holding portion 15. The constituent material of the raised section 17 is preferably the same as the constituent material of the seed crystal holding portion 15. The raised section 17 is preferably formed in an integral manner with the seed crystal holding portion 15.

When a rectangular raised section 17 is provided as shown in FIG. 6, the width D4 of the raised section 17 is preferably 1 to 5 mm. The height D5 of the raised section 17 of the seed crystal holding portion 15 is preferably 5 mm or greater. If the width D4 and height D5 of the raised section 17 have a width and/or thickness in these ranges, it will be possible to more stably minimize generation of cracks. If the height D5 is too thick, the temperature of the outer peripheral section will be too high, and therefore for stable concave crystal growth the height D5 is preferably no greater than 15 mm.

If the thickness of the perimeter of the seed crystal holding portion 15 is to be made larger, the thickness at the center section of the seed crystal holding portion 15 can be further reduced, and the thickness at the center section of the seed crystal holding portion 15 is preferably 0.1 mm or greater.

Figure 7:
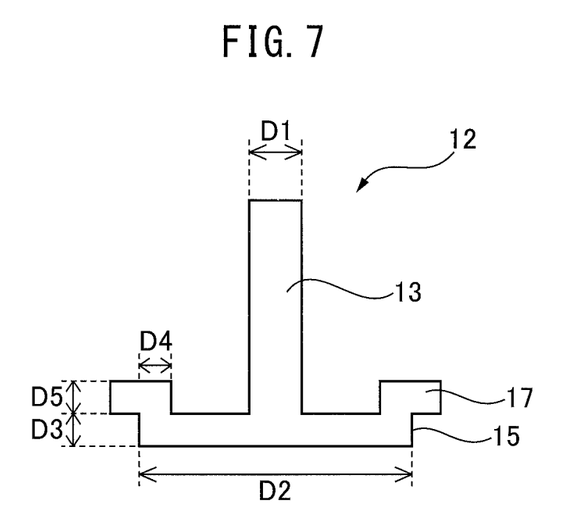
FIG. 7 is a cross-sectional schematic drawing showing an embodiment of a seed crystal holding shaft that may be used in the method of the present disclosure.
Figure 8:
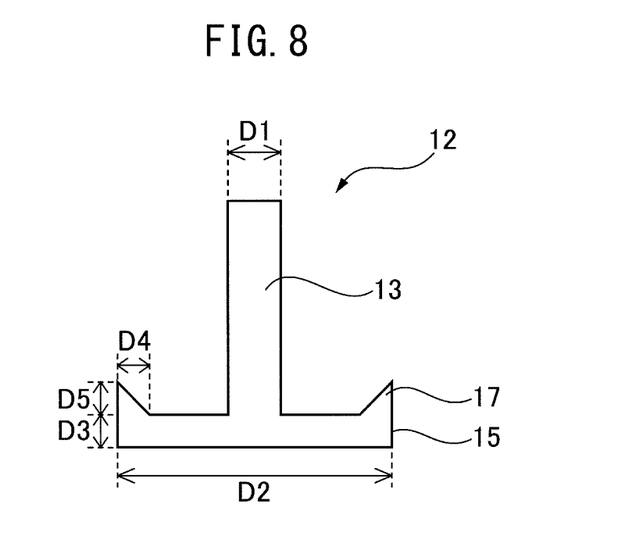
FIG. 8 is a cross-sectional schematic drawing showing an embodiment of a seed crystal holding shaft that may be used in the method of the present disclosure.

The raised section 17 may have any desired shape other than the shape in FIG. 6, and for example, it may have the construction illustrated in FIG. 7 or FIG. 8.

The raised section 17 shown in FIG. 7 has a shape that widens directly above the perimeter of the seed crystal holding portion 15 and outward. Even when the raised section 17 has such a shape, the bottom face of the seed crystal holding portion 15 that contacts with the seed crystal substrate 14 is still identical to the bottom face of the seed crystal holding portion 15 shown in FIG. 6, and therefore as long as the ratio D1/D2 satisfies the proportion specified above, the seed crystal holding shaft 12 shown in FIG. 7 will produce substantially the same effect as the seed crystal holding shaft 12 shown in FIG. 6.

The raised section 17 shown in FIG. 8 has a triangular cross-section. Even when the raised section 17 has such a shape, the bottom face of the seed crystal holding portion 15 that contacts with the seed crystal substrate 14 is still identical to the bottom face of the seed crystal holding portion 15 shown in FIG. 6, and therefore as long as the ratio D1/D2 satisfies the proportion specified above, the seed crystal holding shaft 12 shown in FIG. 7 will produce substantially the same effect as the seed crystal holding shaft 12 shown in FIG. 6. Since the raised section of FIG. 8 has a smaller volume than the raised section of FIG. 6, the width D4 or height D5 may be made larger than the raised section of FIG. 6.

Whether or not a concave growth surface has been obtained can be determined by measuring the thickness at the center section and outer peripheral section of the grown crystal. By using a seed crystal substrate having a flat growth surface with an on-axis surface 16 of crystal growth, it is possible to determine whether or not a concave growth surface has been obtained by simply measuring the magnitude relationship between the thicknesses at the center section and the outer peripheral section of the grown crystal.

The maximum angle θ of the inclination of the concave crystal growth surface with respect to the on-axis surface 16 of crystal growth is preferably in the range of $0<\theta\leq 8°$, more preferably in the range of $1\leq\theta\leq 8°$, even more preferably in the range of $2\leq\theta\leq 8°$ and yet more preferably in the range of $4\leq\theta\leq 8°$. If the maximum angle θ of the inclination of the concave crystal growth surface is within the above range, it will be possible to more stably minimize generation of inclusions.

The maximum angle θ of the inclination can be measured by any desired method. For example, when a SiC single crystal with a concave crystal growth surface 20 is grown using a seed crystal substrate 14 having an on-axis surface 16, as shown in FIG. 12, it is possible to measure the maximum angle θ as the inclination of the tangent line on the outermost peripheral section of the concave crystal growth surface 20 with respect to the on-axis surface 16 of the seed crystal substrate 14.

Figure 13:
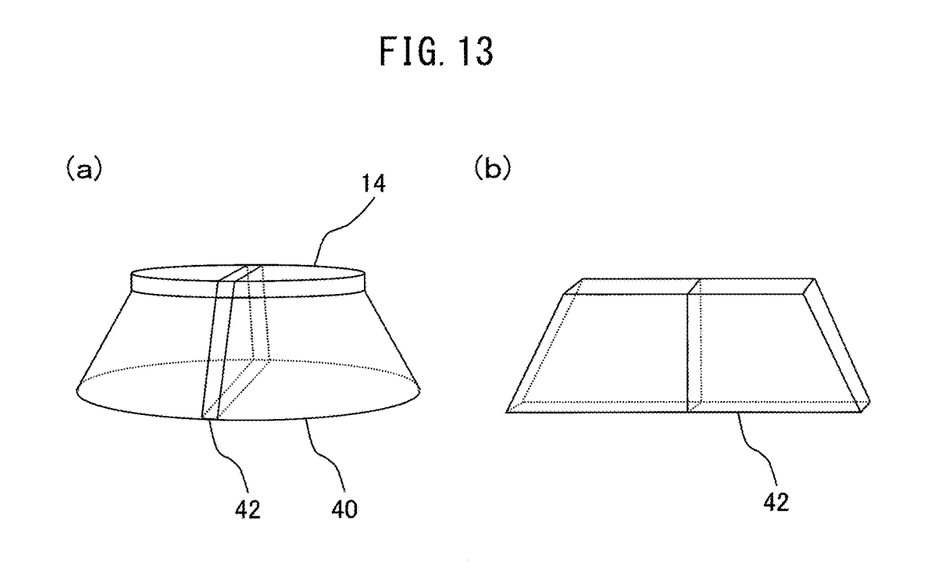
FIG. 13 is a pair of schematic diagrams showing locations where a grown crystal is cut when examining the presence of inclusions in the grown crystal.

The method of examining inclusions is not particularly restricted, and as shown in FIG. 13(a), the grown crystal 40 may be sliced parallel to the growth direction to cut out a grown crystal 42 as shown in FIG. 13(b), and observation may be made of whether or not the entire surface of the grown crystal 42 is a continuous crystal based on a transmission image, to allow examination of the presence of inclusions. When the grown crystal 40 is grown in a substantially concentrical manner, it may be further cut in half at the center section of the cut out grown crystal 42, and the presence of inclusions in the half-cut grown crystal 42 may be examined by the same method. The grown crystal may also be sliced perpendicularly in the growth direction, and the presence of inclusions in the cut grown crystal may be examined by the same method. Alternatively, the grown crystal may be cut out as described above and subjected to energy dispersive X-ray spectroscopy (EDX) or wavelength dispersive X-ray analysis (WDX) for qualitative analysis or quantitative analysis of the Si—C solution component in the cut out grown crystal, to allow detection of inclusions.

With observation of the transmission image, since visible light is not transmitted at the sections where inclusions are present, the sections where visible light is not transmitted may be detected as inclusions. According to elemental analysis by EDX or WDX, when a Si/Cr-based solvent or Si/Cr/Ni-based solvent is used as the Si—C solution, for example, it is analyzed whether solvent components other than Si and C, such as Cr or Ni, are present in the grown crystal, and the solvent components other than Si and C, such as Cr or Ni, can be detected as inclusions.

The method of examining for cracks is not particularly restricted, and the presence or absence of cracks can be confirmed by external observation of the grown crystal using an optical microscope.

The growth surface of the SiC single crystal may be the (0001) surface (also referred to as the Si-surface) or the (000-1) surface (also referred to as the C-surface).

The diameter of the SiC grown single crystal obtained by the method of the present disclosure is preferably 30 mm or greater, more preferably 40 mm or greater, even more preferably 45 mm or greater and yet more preferably 50 mm or greater. By the method of the present disclosure it is possible to obtain a SiC single crystal that contains no inclusions across the above entire diameter range.

The growth thickness of the SiC grown single crystal obtained by the method of the present disclosure is preferably 1 mm or greater, more preferably 2 mm or greater, even more preferably 3 mm or greater, yet more preferably 4 mm or greater and even yet more preferably 5 mm or greater. According to the invention it is possible to obtain a SiC single crystal that contains no inclusions across the above entire thickness range.

A SiC single crystal having a thickness and/or diameter exceeding the above thickness and/or diameter may be grown, and preferably it contains no inclusions even in the crystalline region exceeding the above thickness and/or diameter. However, the invention does not exclude a SiC single crystal containing inclusions in the crystalline region exceeding the above thickness and/or diameter, so long as the SiC single crystal obtained has no inclusions throughout the region having the above thickness and/or diameter. The maximum angle θ of the inclination of the concave crystal growth surface may therefore be measured, for example, as the angle with respect to the on-axis surface 16 at a location where the desired diameter is obtained in the crystal growth surface 20.

In the method of the present disclosure, a meniscus may be formed between the seed crystal substrate and the Si—C solution. Formation of a meniscus will further facilitate formation of a temperature distribution in the horizontal direction such that the temperature of the Si—C solution at the outer peripheral section is lower than at the center section directly below the crystal growth surface.

Figure 14:
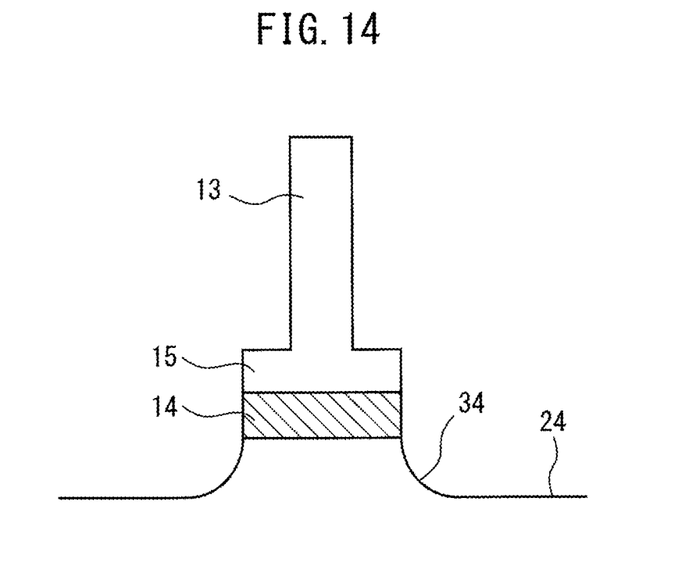
FIG. 14 is a cross-sectional schematic drawing of a meniscus formed between a seed crystal substrate and a Si—C solution.

The term "meniscus" refers to a concave curved surface 34 formed on the surface of the Si—C solution 24 raised by surface tension upon wetting of the seed crystal substrate 14, as shown in FIG. 14. It is possible to grow a SiC single crystal while forming a meniscus 34 between the seed crystal substrate 14 and the Si—C solution 24. To form a meniscus, for example, after the seed crystal substrate has been contacted with the Si—C solution, the seed crystal substrate may be raised and held at a position where the bottom face of the seed crystal substrate is higher than the liquid level of the Si—C solution.

Since the meniscus portion formed on the outer peripheral section of the growth interface is at a lower temperature due to radiative heat loss, formation of the meniscus can facilitate creation of a temperature gradient in which the temperature of the Si—C solution is lower at the outer peripheral section than at the center section directly below the interface with the crystal growth surface.

In the method of the present disclosure, gas may be blown in from the outer peripheral side of the grown crystal. Blowing in gas from the outer peripheral side of the grown crystal will further facilitate formation of a temperature distribution in the horizontal direction such that the temperature of the Si—C solution at the outer peripheral section is lower than at the center section directly below the crystal growth surface.

In the method of the present disclosure, the seed crystal substrate may be continuously rotated in a fixed direction at a prescribed speed for a prescribed time or longer. By rotating the seed crystal substrate continuously in a fixed direction at a fixed speed for at least a prescribed period of time, it is possible to promote flow of the Si—C solution directly below the crystal growth interface, and in particular to eliminate stagnated flow sections of the Si—C solution at the outer peripheral sections and more stably minimize incorporation of inclusions at the outer peripheral sections.

The rotational speed of the seed crystal substrate is the speed at the outermost peripheral section of the growth surface (bottom face) of the seed crystal substrate. The speed at the outermost peripheral section of the seed crystal substrate is preferably a speed that is greater than 25 mm/sec, more preferably at least 45 mm/sec and even more preferably at least 63 mm/sec. Limiting the speed at the outermost peripheral section of the seed crystal substrate to within the above range will allow inclusions to be more stably minimized.

When the speed at the outermost peripheral section of the seed crystal substrate is controlled to promote growth of the SiC single crystal, the grown crystal will usually grow to have the same diameter or an enlarged diameter with respect to the growth surface of the seed crystal substrate, and therefore the rotational speed at the outermost peripheral section of the grown crystal will be the same as or greater than the speed at the outermost peripheral section of the seed crystal substrate. Thus, controlling the speed at the outermost peripheral section of the seed crystal substrate to within the aforementioned range allows flow of the Si—C solution to continue directly below the grown crystal even when crystal growth has proceeded.

The speed at the outermost peripheral section of the grown crystal may be controlled to within the aforementioned speed range, instead of controlling the speed at the outermost peripheral section of the seed crystal substrate. As growth of the SiC single crystal proceeds, the grown crystal generally grows in a manner such that its diameter is the same or an enlarged diameter with respect to the growth surface of the seed crystal substrate, resulting in an increasing speed at the outer peripheral section of the grown crystal. In that case, the rotational speed per minute (rpm) may be maintained, or the rotational speed per minute (rpm) may be reduced so that the speed at the outermost peripheral section of the grown crystal is constant.

When the seed crystal substrate is rotated in this manner the crucible may also be rotated. The crucible may be rotated together with the seed crystal substrate in a range in which the aforementioned rotational speed at the outer peripheral section of the seed crystal substrate is obtained relative to the Si—C solution flowing by rotation of the crucible.

The rotational direction of the seed crystal substrate may be periodically switched. By periodically switching the rotational direction of the seed crystal substrate it is possible to grow a concentric SiC single crystal and more stably minimize generation of defects that can occur in the grown crystal. If rotation in the same direction is maintained for a prescribed period of time or longer, it will be possible to stabilize flow of the Si—C solution directly below the crystal growth interface, and to more stably minimize inclusion of the solution at the outer peripheral section.

When the rotational direction of the seed crystal substrate is to be periodically changed, the rotation holding time in the same direction is preferably longer than 30 seconds, more preferably 200 seconds or longer and even more preferably 360 seconds or longer. Limiting the rotation holding time in the same direction of the seed crystal substrate to within the above range can more stably minimize inclusions.

When the rotational direction of the seed crystal substrate is periodically changed, a shorter time for the stopping time of the seed crystal substrate during switching of the rotational direction in the reverse direction is desired, and it is preferably no greater than 10 seconds, more preferably no greater than 5 seconds, even more preferably no greater than 1 second and yet more preferably substantially 0 seconds.

The present disclosure further relates to an apparatus for producing a SiC single crystal comprising a crucible that accommodates a Si—C solution, a heating device situated on the periphery of the crucible, and a seed crystal holding shaft situated in a movable manner in the vertical direction, the apparatus being based on a solution process in which the seed crystal substrate held on the seed crystal holding shaft is contacted with the Si—C solution that has been heated so as to have a temperature gradient such that the temperature decreases from the interior toward the liquid level, to grow a SiC single crystal from the seed crystal substrate, wherein the seed crystal holding shaft has a shaft portion and a seed crystal holding portion at the bottom end of the shaft portion, and the ratio of the diameter D1 of the shaft portion to the diameter D2 of the seed crystal holding portion (D1/D2) is no greater than 0.28.

The aforementioned description of the production method is applied for the construction of this apparatus.

A Si—C solution is a solution in which C is dissolved, the solvent being a molten liquid of Si or Si/X (X being one or more metals other than Si). X is not particularly restricted so long as it is one or more metals and can form a liquid phase (solution) that is in a state of thermodynamic equilibrium with SiC (the solid phase). Suitable examples of X metals include Ti, Mn, Cr, Ni, Ce, Co, V and Fe.

The Si—C solution is preferably a Si—C solution wherein the solvent is a molten liquid of Si/Cr/X (where X represents one or more metals other than Si and Cr). More preferred is a Si—C solution wherein the solvent is a molten liquid with an atomic composition percentage of Si/Cr/X=30-80/20-60/0-10, since it has low variation in C dissolution. For example, Cr, Ni and the like may be loaded into the crucible in addition to Si, to form a Si—Cr solution, Si—Cr—Ni solution or the like.

The Si—C solution preferably has a surface temperature of 1800° C. to 2200° C., which will minimize fluctuation in the amount of dissolution of C into the Si—C solution.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

Figure 1:
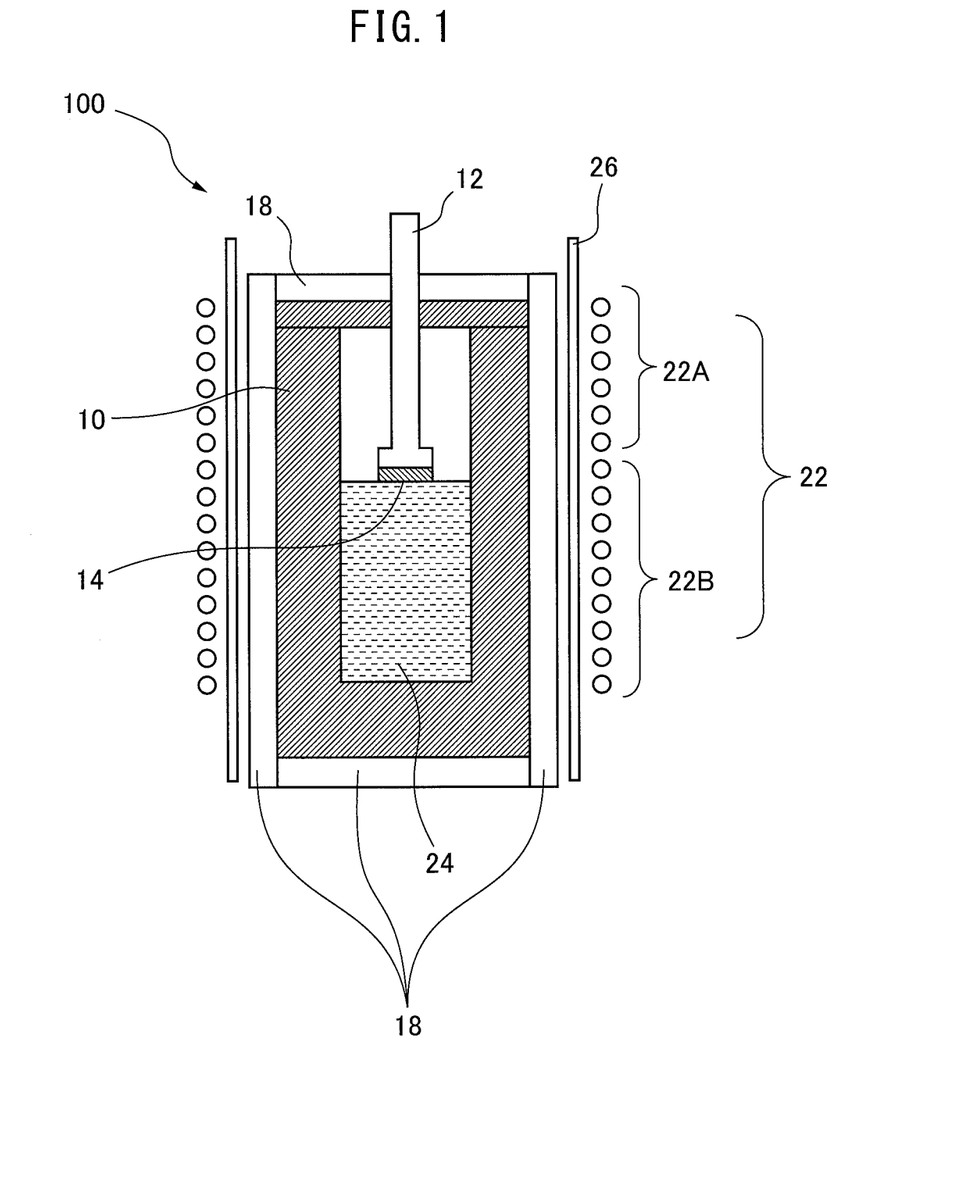
FIG. 1 is a cross-sectional schematic drawing showing an example of a SiC single crystal production apparatus that may be used in the method of the present disclosure.

FIG. 1 shows an example of a SiC single crystal production apparatus for carrying out the invention. The illustrated SiC single crystal production apparatus 100 comprises a crucible 10, wherein the crucible 10 accommodates a Si—C solution 24 having C dissolved in a molten liquid of Si or Si/X, a temperature gradient is formed such that the temperature is decreased from the interior of the Si—C solution toward the surface of the solution, and the seed crystal substrate 14 that is held at the tip of the vertically movable seed crystal holding shaft 12 is contacted with the Si—C solution 24 to allow growth of the SiC single crystal from the seed crystal substrate 14.

The Si—C solution 24 is prepared by loading the starting materials into the crucible, melting them by heating to prepare Si or Si/X molten liquid, and dissolving C therein. If the crucible 10 is a carbonaceous crucible, such as a graphite crucible, or SiC crucible, C will dissolve into the molten liquid by dissolution of the crucible 10, thereby allowing a Si—C solution to be formed. This will avoid the presence of undissolved C in the Si—C solution 24, and prevent waste of SiC due to deposition of the SiC single crystal onto the undissolved C. The supply of C may be carried out by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 for heating is disposed around the outer periphery of the quartz tube 26. The high-frequency coil 22 may be configured with an upper level coil 22A and a lower level coil 22B. The upper level coil 22A and lower level coil 22B are independently controllable.

Since the temperature of the crucible 10, heat-insulating material 18, quartz tube 26 and high-frequency coil 22 become high, they are situated inside a water-cooling chamber. The water-cooling chamber is provided with a gas inlet and a gas exhaust vent to allow atmospheric modification in the apparatus.

The crucible 10 comprises an opening 28 at the top through which the seed crystal holding shaft 12 passes. By adjusting the gap (spacing) between the crucible 10 and the seed crystal holding shaft 12 at the opening 28, it is possible to vary the amount of radiative heat loss from the surface of the Si—C solution 24. Although it is usually necessary to keep the interior of the crucible 10 at high temperature, setting a large gap between the crucible 10 and the seed crystal holding shaft 12 at the opening 28 can increase radiative heat loss from the surface of the Si—C solution 24, while setting a small gap between the crucible 10 and the seed crystal holding shaft 12 at the opening 28 can reduce radiative heat loss from the surface of the Si—C solution 24. When a meniscus is formed, radiative heat loss can take place from the meniscus portion as well.

The temperature of the Si—C solution will usually have a temperature distribution with a lower temperature at the surface than the interior of the Si—C solution due to radiation and the like. Further, by adjusting the number of turns and spacing of the high-frequency coil 22, the positional relationship of the high-frequency coil 22 and the crucible 10 in the height direction, and the output of the high-frequency coil, it is possible to form a temperature gradient in the Si—C solution 24 in the direction perpendicular to the surface of the Si—C solution 24 so that the upper portion of the solution contacting the seed crystal substrate 14 is at low temperature and the lower portion (interior) of the solution is at high temperature. For example, the output of the upper level coil 22A may be smaller than the output of the lower level coil 22B, to form a temperature gradient in the Si—C solution 24 in which the upper portion of the solution is at low temperature and the lower portion of the solution is at high temperature. For example, the temperature gradient is preferably 1-100° C./cm and more preferably 10-50° C./cm, in a range of a depth of up to about 30 mm from the solution surface.

The C that has dissolved in the Si—C solution 24 is dispersed by diffusion and convection. In the region near the bottom face of the seed crystal substrate 14, a temperature gradient can be formed so that it is at lower temperature than the interior of the Si—C solution 24, due to control of output from the heating device, heat radiation from the surface of the Si—C solution 24, and heat loss through the seed crystal holding shaft 12. When the C that has dissolved into the solution interior that is at high temperature and has high solubility reaches the region near the seed crystal substrate that is at low temperature and has low solubility, a supersaturated state appears and a SiC crystal is grown on the seed crystal substrate 14 by virtue of supersaturation as a driving force.

In some embodiments, meltback may be carried out in which the surface layer of the seed crystal substrate is dissolved in the Si—C solution and removed prior to growth of a SiC single crystal. Since the surface layer of the seed crystal substrate on which the SiC single crystal is to be grown may have an affected layer, such as a dislocation, a natural oxide film, or the like, removal of these by dissolution prior to growth of a SiC single crystal is effective for growing a high-quality SiC single crystal. Although the thickness of a layer to be dissolved depends on the processed conditions of the surface of a seed crystal substrate, it is preferably about 5 to 50 µm for sufficient removal of an affected layer and a natural oxide film.

The meltback may be carried out by forming in the Si—C solution a temperature gradient in which the temperature increases from the interior of the Si—C solution toward the surface of the solution, i.e. by forming a temperature gradient in a direction opposite to the case of the SiC single crystal growth. The temperature gradient in the opposite direction can be formed by controlling the output of the high-frequency coil.

The meltback can also be carried out without forming a temperature gradient in the Si—C solution, by simply immersing the seed crystal substrate in the Si—C solution that has been heated to a temperature higher than the liquidus temperature. In this case, the dissolution rate increases with higher Si—C solution temperature, but control of the amount of dissolution is difficult, while a low temperature may slow the dissolution rate.

For some embodiments, the seed crystal substrate may be preheated in advance, and then the same is contacted with the Si—C solution. If the seed crystal substrate at a low temperature is contacted with the Si—C solution at high temperature, heat shock dislocation may be generated in the seed crystal. Preheating of the seed crystal substrate before contacting the seed crystal substrate with the Si—C solution prevents heat shock dislocation and is effective for growth of a high-quality SiC single crystal. The seed crystal substrate may be heated together with the seed crystal holding shaft. In this case, heating of the seed crystal holding shaft is stopped after contact of the seed crystal substrate with the Si—C solution and before growth of the SiC single crystal. Alternatively, the Si—C solution may be heated to the temperature for crystal growth after contacting the seed crystal with the Si—C solution at a relatively low temperature. This is also effective for preventing heat shock dislocation and growing a high-quality SiC single crystal.

EXAMPLES

Example 1

There was prepared a SiC single crystal formed by a sublimation process, which was a discoid 4H—SiC single crystal with a diameter of 43 mm, a thickness of 500 µm, and the bottom face as the (000-1) on-axis surface, for use as a seed crystal substrate 14.

A graphite shaft having a cylindrical shaft portion 13 with a diameter D1 of 12 mm and a length of 40 cm and a discoid seed crystal holding portion 15 with a diameter D2 of 43 mm and a thickness of 5 mm, such as shown in FIG. 3, was prepared as a seed crystal holding shaft 12.

The top face of the seed crystal substrate 14 was bonded to the bottom face of the seed crystal holding portion 15 by using a carbon adhesive so that the bottom face of the seed crystal substrate 14 is the (000-1) surface.

A single crystal production apparatus 100 as shown in FIG. 1 was used, and Si/Cr/Ni was loaded as a molten liquid material at an atomic composition percentage of 56:40:4, into a graphite crucible 10 with an inner diameter of 70 mm and a height of 125 mm, accommodating a Si—C solution 24.

After vacuum suction of the interior of the single crystal production apparatus 100 to $1 \times 10^{-3}$ Pa, argon gas was introduced to 1 atmosphere and the air inside the single crystal production apparatus 100 was exchanged with argon. A high-frequency coil 22 as a heating device situated around the periphery of the graphite crucible 10 was electrified to melt the starting material in the graphite crucible 10 by heating, thereby forming a Si/Cr/Ni alloy molten liquid. Then, a sufficient amount of C was dissolved into the Si/Cr/Ni alloy molten liquid from the graphite crucible 10 to form a Si—C solution 24.

The outputs of the upper level coil 22A and lower level coil 22B were adjusted to heat the graphite crucible 10 so that the temperature of the surface of the Si—C solution 24 was increased to 2000° C., and an average temperature gradient in which the temperature decreased from the solution interior in a range of 1 cm from the Si—C solution 24 surface toward the solution surface, was 30° C./cm. Temperature measurement of the surface of the Si—C solution 24 was performed with a radiation thermometer, and measurement of the temperature gradient of the Si—C solution 24 was conducted by using a vertically movable thermocouple.

Seed touching was conducted, in which the position of the bottom face of the seed crystal substrate 14 was placed at a position matching the liquid level of the Si—C solution 24, and the bottom face of the seed crystal substrate 14 was contacted with the Si—C solution 24, while keeping the bottom face of the seed crystal substrate 14 that was bonded to the seed crystal holding portion 15, parallel to the liquid level of the Si—C solution 24, and the substrate was held at that position for 12 hours to grow a crystal.

Upon completion of the crystal growth, the seed crystal holding shaft 12 was raised and cooled to room temperature, the seed crystal substrate 14 and the SiC crystal grown from the seed crystal substrate were severed from the Si—C solution 24 and the seed crystal holding shaft 12 and were recovered. The obtained grown crystal had a concave growth surface with a diameter of 46 mm. The diameter of the obtained grown crystal was the diameter projected onto the (000-1) on-axis surface. This applies to all of the diameters mentioned below.

As shown in FIG. 13, the obtained SiC single crystal was cut to a thickness of 1 mm together with the seed crystal substrate 14 so that the center section of the growth surface in the direction parallel to the growth direction was included, and it was further cut in half at the center section and subjected to mirror polishing. The cross-section of the cut grown crystal was observed under an optical microscope in transparent mode. No inclusions were present in the grown crystal. However, cracking was confirmed in the grown crystal.

Example 2

A SiC crystal was grown and recovered under the same conditions as Example 1, except that a SiC single crystal produced by a sublimation process, which was a discoid 4H—SiC single crystal with a diameter of 46 mm, a thickness of 500 μm, and the bottom face having a (000-1) on-axis surface, was used as the seed crystal substrate 14, a graphite shaft having a cylindrical shaft portion with a diameter D1 of 12 mm and a length of 40 cm and a discoid seed crystal holding portion with a diameter D2 of 46 mm and a thickness of 5 mm was used as the seed crystal holding shaft, and the crystal growth time was 40 hours.

The obtained grown crystal had a concave growth surface with a diameter of 54 mm, and contained no inclusions. However, cracking was confirmed in the grown crystal.

Example 3

A SiC crystal was grown and recovered under the same conditions as Example 1, except that a SiC single crystal produced by a sublimation process, which was a discoid 4H—SiC single crystal with a diameter of 50 mm, a thickness of 500 μm, and the bottom face having a (000-1) on-axis surface, was used as the seed crystal substrate 14, and a graphite shaft having a cylindrical shaft portion with a diameter D1 of 12 mm and a length of 40 cm and a discoid seed crystal holding portion with a diameter D2 of 50 mm and a thickness of 5 mm was used as the seed crystal holding shaft.

Figure 9:
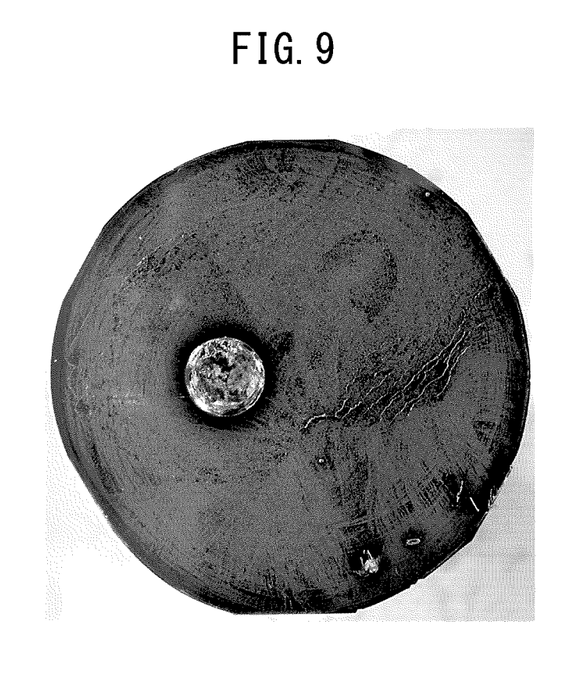
FIG. 9 is an observational photograph of a SiC single crystal grown in Example 3, as seen from the growth surface.

FIG. 9 shows an external photograph of the obtained grown crystal observed from the growth surface. The obtained grown crystal had a concave growth surface with a diameter of 53 mm, and contained no inclusions. However, cracking was confirmed in the grown crystal.

Example 4

A SiC crystal was grown and recovered under the same conditions as Example 1, except that a SiC single crystal produced by a sublimation process, which was a discoid 4H—SiC single crystal with a diameter of 38 mm, a thickness of 500 μm, and the bottom face having a (000-1) on-axis surface, was used as the seed crystal substrate 14, a graphite shaft having a cylindrical shaft portion with a diameter D1 of 8 mm and a length of 40 cm and a discoid seed crystal holding portion with a diameter D2 of 38 mm and a thickness of 5 mm was used as the seed crystal holding shaft, and the crystal growth time was 10 hours.

The obtained grown crystal had a concave growth surface with a diameter of 40 mm, and contained no inclusions. However, cracking was confirmed in the grown crystal.

Example 5

A SiC crystal was grown and recovered under the same conditions as Example 1, except that a SiC single crystal produced by a sublimation process, which was a discoid 4H—SiC single crystal with a diameter of 50 mm, a thickness of 500 μm, and the bottom face having a (000-1) on-axis surface, was used as the seed crystal substrate 14, a graphite shaft having a cylindrical shaft portion with a diameter D1 of 8 mm and a length of 40 cm and a discoid seed crystal holding portion with a diameter D2 of 50 mm and a thickness of 5 mm was used as the seed crystal holding shaft, and the crystal growth time was 5 hours.

The obtained grown crystal had a concave growth surface with a diameter of 52 mm, and contained no inclusions. However, cracking was confirmed in the grown crystal.

Example 6

A SiC crystal was grown and recovered under the same conditions as Example 1, except that a SiC single crystal produced by a sublimation process, which was a discoid 4H—SiC single crystal with a diameter of 50 mm, a thickness of 500 μm, and the bottom face having a (000-1) on-axis surface, was used the seed crystal substrate 14, and a graphite shaft having a cylindrical shaft portion with a diameter D1 of 12 mm and a length of 40 cm and a discoid seed crystal holding portion with a diameter D2 of 50 mm and a thickness of 5 mm, and having a rectangular raised section 17 with a width of 5 mm and a height of 5 mm on the perimeter of the seed crystal holding portion, such as shown in FIG. 6, was used as the seed crystal holding shaft.

Figure 10:
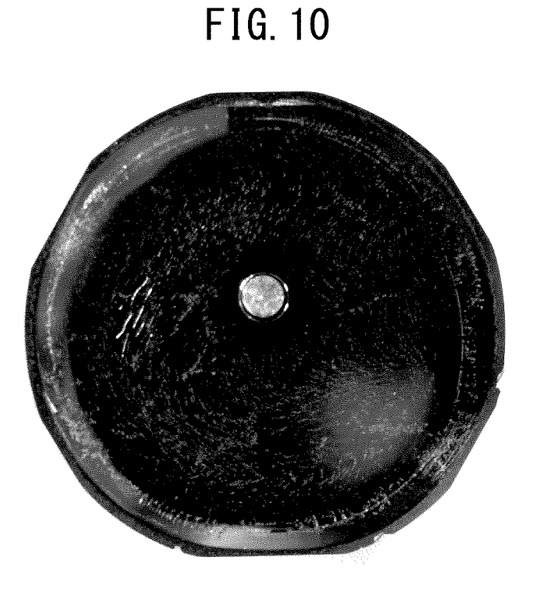
FIG. 10 is an observational photograph of a SiC single crystal grown in Example 6, as seen from the growth surface.

FIG. 10 shows an external photograph of the obtained grown crystal observed from the growth surface. The obtained grown crystal had a concave growth surface with a diameter of 53 mm, contained no inclusions, and also exhibited no cracking.

Comparative Example 1

A SiC crystal was grown and recovered under the same conditions as Example 1, except that a SiC single crystal produced by a sublimation process, which was a discoid 4H—SiC single crystal with a diameter of 40 mm, a thickness of 500 μm, and the bottom face having a (000-1) on-axis surface, was used as the seed crystal substrate 14, a cylindrical graphite shaft with a diameter of 40 mm and a length of 40 cm, and having the same diameter for the shaft portion and the seed crystal holding portion, was used as the seed crystal holding shaft, and the crystal growth time was 15 hours.

Figure 11:
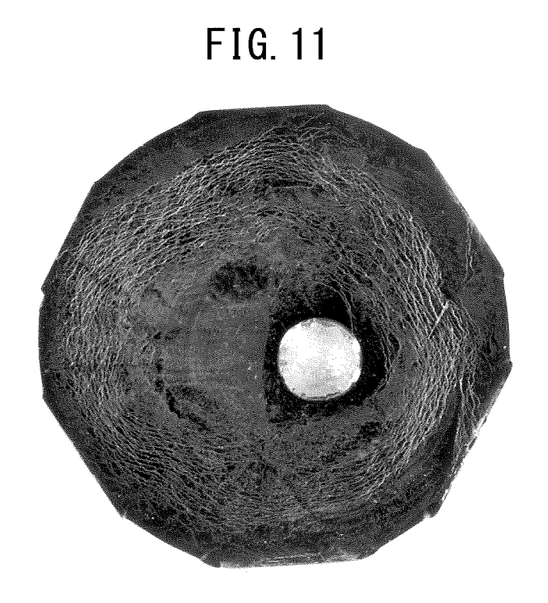
FIG. 11 is an observational photograph of the SiC single crystal grown in Comparative Example 1, as seen from the growth surface.

FIG. 11 shows an external photograph of the obtained grown crystal observed from the growth surface. The obtained grown crystal had a convex growth surface with a diameter of 43 mm, and contained inclusions.

Comparative Example 2

A SiC crystal was grown and recovered under the same conditions as Example 1, except that a SiC single crystal produced by a sublimation process, which was a discoid 4H—SiC single crystal with a diameter of 45 mm, a thickness of 500 μm, and the bottom face having a (000-1) on-axis surface, was used as the seed crystal substrate 14, and a graphite shaft having a cylindrical shaft portion with a diameter D1 of 27 mm and a length of 40 cm and a discoid seed crystal holding portion with a diameter D2 of 45 mm and a thickness of 5 mm was used as the seed crystal holding shaft.

The obtained grown crystal had a convex growth surface with a diameter of 48 mm, and contained inclusions.

Comparative Example 3

A SiC crystal was grown and recovered under the same conditions as Example 1, except that a SiC single crystal produced by a sublimation process, which was a discoid 4H—SiC single crystal with a diameter of 40 mm, a thickness of 500 μm, and the bottom face having a (000-1) on-axis surface, was used as the seed crystal substrate 14, a graphite shaft having a cylindrical shaft portion with a diameter D1 of 12 mm and a length of 40 cm and a discoid seed crystal holding portion with a diameter D2 of 40 mm and a thickness of 5 mm was used as the seed crystal holding shaft, and the crystal growth time was 15 hours.

The obtained grown crystal had a convex growth surface with a diameter of 43 mm, and contained inclusions.

The constructions of the seed crystal holding shafts used in Examples 1 to 6 and Comparative Examples 1 to 3 and the grown crystal properties, are summarized in Table 1.

TABLE 1

|  | D1 (mm) | D2 (mm) | D1/D2 | Growth surface shape crystal (mm) | Thickness at center section of grown crystal (mm) | Thickness at perimeter of grown | Inclusions | Cracking in grown crystal | Diameter of grown crystal (mm) |
|---|---|---|---|---|---|---|---|---|---|
| Example 1 | 12 | 43 | 0.28 | Concave | 2.45 | 3.28 | Absent | Present | 46 |
| Example 2 | 12 | 46 | 0.26 | Concave | 3.00 | 3.94 | Absent | Present | 54 |
| Example 3 | 12 | 50 | 0.24 | Concave | 2.47 | 2.91 | Absent | Present | 53 |
| Example 4 | 8 | 38 | 0.21 | Concave | 1.88 | 2.17 | Absent | Present | 40 |
| Example 5 | 8 | 50 | 0.16 | Concave | 0.27 | 1.87 | Absent | Present | 52 |
| Example 6 | 12 | 50 | 0.24 | Concave | 1.80 | 2.28 | Absent | Absent | 53 |
| Comp. Ex. 1 | 40 | 40 | 1.0 | Convex | 2.98 | 2.03 | Present | Present | 43 |
| Comp. Ex. 2 | 27 | 45 | 0.60 | Convex | 3.20 | 2.40 | Present | Present | 48 |
| Comp. Ex. 3 | 12 | 40 | 0.30 | Convex | 2.74 | 2.63 | Present | Present | 43 |

EXPLANATION OF SYMBOLS

100 Single crystal production apparatus
10 Crucible
12 Seed crystal holding shaft
13 Shaft portion
14 Seed crystal substrate
15 Seed crystal holding portion
16 On-axis surface of seed crystal substrate
18 Heat-insulating material
20 Growth surface
22 High-frequency coil
22A Upper level high-frequency coil
22B Lower level high-frequency coil
24 Si—C solution
26 Quartz tube
34 Meniscus
40 SiC grown crystal
42 Cut grown crystal

What is claimed is:

1. A method for producing a SiC single crystal in which a seed crystal substrate held on a seed crystal holding shaft is contacted with a Si—C solution having a temperature gradient such that the temperature decreases from the interior toward the liquid level, to cause crystal growth of a SiC single crystal, wherein
the SiC single crystal is grown to a diameter of 30 mm or more and a thickness of 1 mm or more while maintaining a concave growth surface, and is grown without inclusions across the entire diameter and thickness ranges,
the seed crystal holding shaft has a shaft portion and a seed crystal holding portion at the bottom end of the shaft portion, and
the ratio of the diameter D1 of the shaft portion to the diameter D2 of the seed crystal holding portion (D1/D2) is no greater than 0.28.

2. The method for producing a SiC single crystal according to claim 1, wherein the thickness at the perimeter of the seed crystal holding portion is larger than the thickness at the center section of the seed crystal holding portion.

3. An apparatus for producing a SiC single crystal comprising:
a crucible that accommodates a Si—C solution,
a heating device situated on the periphery of the crucible, and
a seed crystal holding shaft situated in a movable manner in the vertical direction,
the apparatus being based on a solution process in which the seed crystal substrate held on the seed crystal holding shaft is contacted with the Si—C solution that has been heated so as to have a temperature gradient such that the temperature decreases from the interior toward the liquid level, to grow a SiC single crystal to a diameter of 30 mm or more with a thickness of 1 mm or more with no inclusions across the entire diameter and thickness ranges, while maintaining a concave growth surface, from the seed crystal substrate, wherein
the seed crystal holding shaft has a shaft portion and a seed crystal holding portion at the bottom end of the shaft portion,
a diameter of the seed crystal holding portion is 30 mm or more, and
the ratio of the diameter D1 of the shaft portion to the diameter D2 of the seed crystal holding portion (D1/D2) is no greater than 0.28.

4. The apparatus for producing a SiC single crystal according to claim 3, wherein the thickness at the perimeter of the seed crystal holding portion is larger than the thickness at the center section of the seed crystal holding portion.

5. The method for producing a SiC single crystal according to claim 1, wherein the diameter to which the SiC single crystal is grown is 40 mm or more.

6. The method for producing a SiC single crystal according to claim 1, wherein the diameter to which the SiC single crystal is grown is 50 mm or more.

7. The method for producing a SiC single crystal according to claim 1, wherein the ratio D1/D2 is no less than 0.05.

8. The method for producing a SiC single crystal according to claim 1, wherein the ratio D1/D2 is no less than 0.10.

9. The method for producing a SiC single crystal according to claim 1, wherein the ratio D1/D2 is no greater than 0.26.

10. The method for producing a SiC single crystal according to claim 1, wherein the ratio D1/D2 is no greater than 0.24.

11. The method for producing a SiC single crystal according to claim 1, wherein a maximum angle $\theta$ of an inclination of the concave crystal growth surface with respect to an on-axis surface of crystal growth is a range of from $0 < \theta \leq 8°$.

12. The method for producing a SiC single crystal according to claim 1, wherein a maximum angle $\theta$ of an inclination of the concave crystal growth surface with respect to an on-axis surface of crystal growth is a range of from $4 \leq \theta \leq 8°$.

13. The apparatus for producing a SiC single crystal according to claim 3, wherein the diameter of the seed crystal holding portion is 40 mm or more.

14. The apparatus for producing a SiC single crystal according to claim 3, wherein the diameter of the seed crystal holding portion is 50 mm or more.

15. The apparatus for producing a SiC single crystal according to claim 3, wherein the ratio D1/D2 is no less than 0.05.

16. The apparatus for producing a SiC single crystal according to claim 3, wherein the ratio D1/D2 is no less than 0.10.

17. The apparatus for producing a SiC single crystal according to claim 3, wherein the ratio D1/D2 is no greater than 0.26.

18. The apparatus for producing a SiC single crystal according to claim 3, wherein the ratio D1/D2 is no greater than 0.24.

* * * * *